United States Patent

Olah

[15] 3,703,833

[45] Nov. 28, 1972

[54] DIFFERENTIAL MOTION MAGNIFYING MECHANISM

[72] Inventor: Emery E. Olah, Des Plaines, Ill.

[73] Assignee: Motorola, Inc., Franklin Park, Ill.

[22] Filed: May 14, 1971

[21] Appl. No.: 143,507

[52] U.S. Cl. ....................74/10.39, 74/33, 74/110, 74/422, 334/7

[51] Int. Cl. ....................F16h 19/04

[58] Field of Search.......74/10.39, 10.8, 10.1, 10, 33, 74/110, 422; 334/7

[56] References Cited

UNITED STATES PATENTS

| | | | |
|---|---|---|---|
| 2,340,393 | 2/1944 | Leishman | 74/10.39 |
| 2,371,267 | 3/1945 | Schwarz | 74/10.39 |

*Primary Examiner*—Milton Kaufman

*Attorney*—Vincent J. Rauner and R. J. La Porte

[57] ABSTRACT

A pushbutton operated mechanism for adjusting the tuning apparatus of a pushbutton type radio receiver, includes a pair of gears, one of which is rotatably mounted on a fixed shaft and the other of which is rotatable on a shaft generally parallel to the shaft of the first gear and movable along a path toward and away therefrom. First and second racks, each engaging a gear, are separated from each other along a path. A pushbutton coupled to the movable gear, when depressed, causes the racks to be moved together along the path toward a fixed marker position therebetween at a preselected setting. A movable control element of the tuning apparatus, also positioned between the racks, is moved thereby to the preselected marker setting in response to the depression of the pushbutton.

11 Claims, 4 Drawing Figures

INVENTOR:
EMERY E. OLAH
BY: Ronald J. LaPorte
ATTY.

INVENTOR:
EMERY E. OLAH
BY: Ronald J. La Porte
ATTY.

DIFFERENTIAL MOTION MAGNIFYING MECHANISM

BACKGROUND OF THE INVENTION

This invention relates generally to pushbutton type radio receivers and more particularly to mechanisms for use with individual ones of the pushbuttons thereof for moving resonance varying tuning apparatus of the radio receiver to predetermined settings.

In a pushbutton type radio receiver it is necessary to be able to accurately adjust, automatically, the tuning apparatus thereof to predetermined settings in response to the depression of pushbuttons provided. It is desirable that a pushbutton be moved only a relatively short distance and that the tuning apparatus be moved over a greater distance in response thereto to a predetermined setting, consistently with little or no error, to provide maximum radio reception.

While various mechanisms are now in use in pushbutton radio receiving equipment which operate satisfactorily for the most part to provide adequate wave signal tuning, the last-mentioned mechanisms can and often do cause the tuning apparatus to be moved to a position slightly out of alignment with a predetermined setting. The latter occurrence in some instances lessens the clarity of the reception of radio signals at the receiver, making it necessary to adjust the tuning apparatus manually for maximum reception.

SUMMARY OF THE INVENTION

Accordingly, it is an object of the present invention to provide in a pushbutton type radio receiver a new and improved mechanism for accurately adjusting the position of the radio tuning apparatus to a predetermined setting in response to the depression of a corresponding pushbutton.

It is a more general object of the present invention to provide a mechanism for accurately aligning a control element with a pre-positioned marker in response to the operation of a movable actuator.

It is another object of the invention to provide a pushbutton operated mechanism of the above described type which avoids the drawbacks of the prior art mechanisms mentioned heretofore.

It is yet another object of the present invention to provide a mechanism of the above described type which is relatively simple in construction, and uses a minimum of components.

Briefly, a preferred embodiment of a pushbutton operated mechanism for adjusting the tuning apparatus of a pushbutton type radio receiver according to the invention, comprises a first gear mounted for rotation about a fixed axis and a second gear mounted for rotation about an axis movable along a path toward and away from the first gear. A first rack is mounted in meshing engagement with the gears on a first side thereof, and second and third racks are mounted in meshing engagement with respective ones of the gears on the side thereof opposite the first rack. A fixed marker is positioned between the second and third racks at a predetermined location corresponding to a setting for the movable core carriage of the tuning apparatus, also positioned between the second and third racks.

Upon depressing the pushbutton connected to the axis of the second movable gear, to move the latter a first predetermined distance, the opposing ends of the second and third racks are moved over a second, greater distance toward each other to clamp therebetween both the movable core carriage and the fixed marker, thereby to move the carriage into alignment with the marker. The latter operation places the tuning apparatus at a predetermined setting.

DETAILED DESCRIPTION

Figure 1:
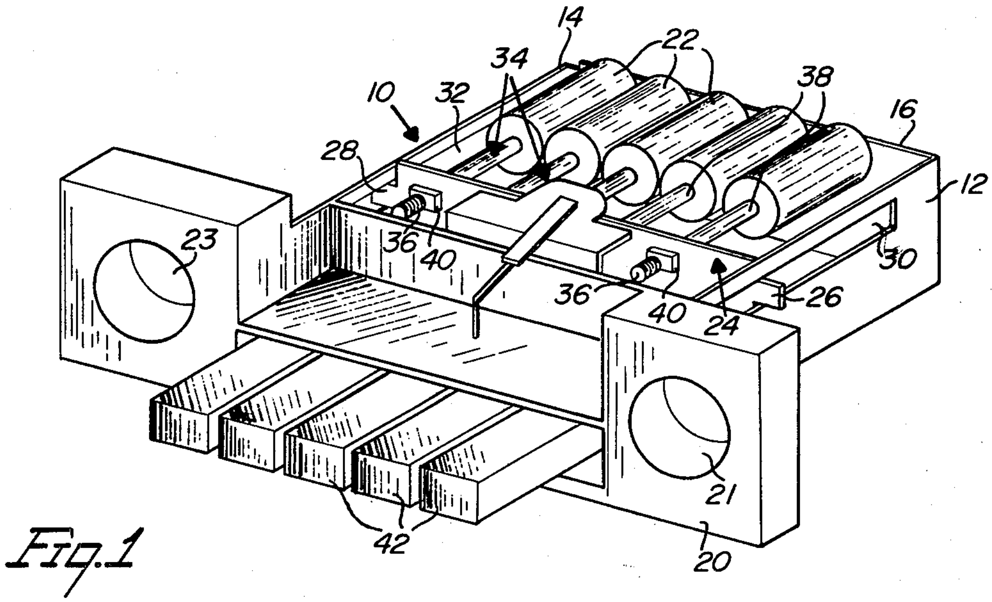
FIG. 1 is a perspective view of a portion of a radio receiver tuner incorporating pushbutton actuated mechanisms according to the invention, for positioning the tuning apparatus thereof to predetermined settings.

Referring now to the drawings, there is illustrated in FIG. 1, a five station pushbutton radio receiver tuner mechanism 10 comprising a housing including side walls 12, 14, a rear wall 16, a base wall 18 (FIG. 3) and a front face plate 20 having apertures 21, 23 through which manual volume control and tuning rods (not shown) extend.

A plurality of tuning coils, such as 22, are mounted adjacent rear wall 16, between side walls 12, 14, and a tuning carriage 24 is slidably supported at its ends 26, 28 which extend through slots 30, 32 in side wall 12, 14, respectively. Mounted on carriage 24 for movement therewith with respect to coils 22, are a plurality of core assemblies, such as 34. Each core assembly includes a threaded rod 36 and a core piece 38 connected thereto. Each rod 36 is screwed into a corresponding socket 40 provided on carriage 24, which serves to connect the core assembly thereto as well as to provide means for adjusting manually the position of core pieces 38 with respect to corresponding coils 22.

When carriage 24 is moved, the position of core pieces 38 with respect to corresponding coils 22 is changed to vary the wave signal reception.

Pushbuttons, such as 42, each corresponding to a different wave signal frequency setting, are provided to move carriage 24 to the corresponding predetermined settings. The pushbuttons are mounted in an elongated opening 43 in front plate 20 for movement from the normal or released position shown in FIGS. 1 and 3 to a depressed position as shown by the pushbutton in FIG. 2 (second from the right as viewed in the figure).

Figure 2:
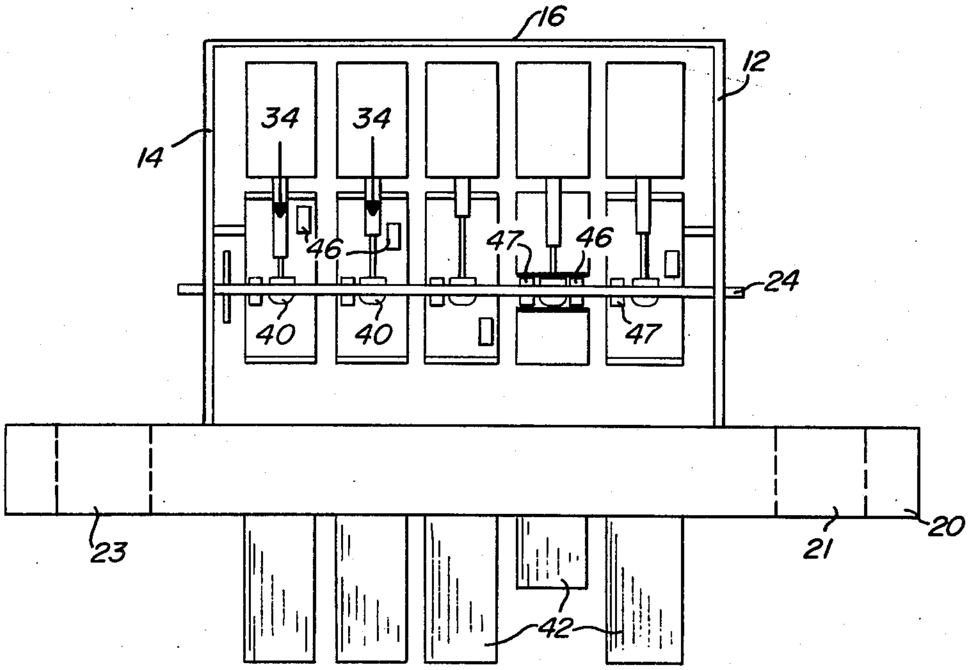
FIG. 2 is a plan view of the tuner of FIG. 1 illustrating the operation of the pushbutton actuated mechanisms according to the invention.
Figure 3:
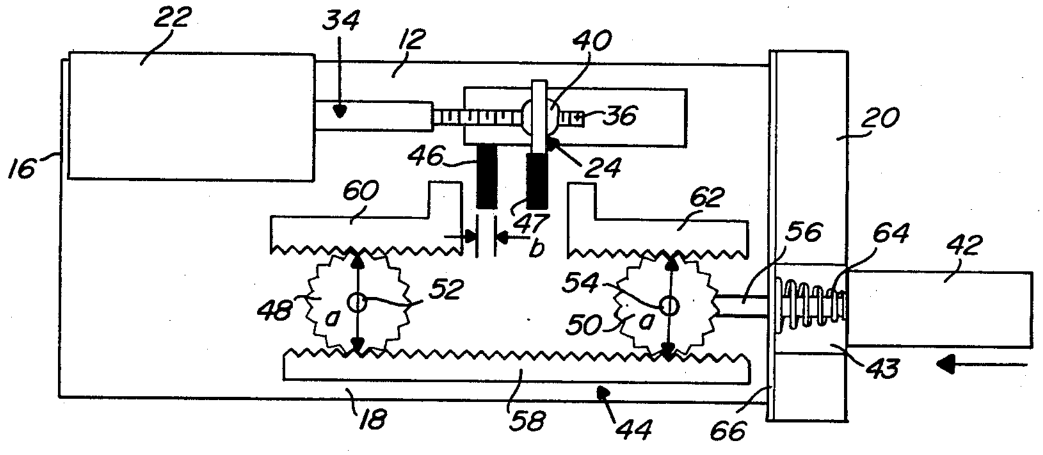
FIG. 3 is a side view of one of the pushbutton actuated mechanisms of FIG. 2.

Referring now to FIG. 3, there is shown therein a mechanism 44 of the type associated with each pushbutton 42, and operated in response to the depression of a corresponding pushbutton, for moving the carriage 24 to a predetermined setting defined by a pre-positioned, fixer marker 46. The carriage 24 includes a plurality of extension blocks 47, one for each pushbutton. The blocks extend downwardly at approximately the same level as the markers 46 and in alignment therewith (see FIG. 2). The width *b* of each of the markers is substantially equal to the width of each of the extensions 47 of carriage 24 (FIG. 3).

Each of the carriage moving mechanisms 44 of FIG. 3 includes a pair of gears 48, 50, having similar diameter lengths *a*. Gear 48 is mounted on a fixed shaft 52 for rotation thereabout. Gear 50 is mounted for rotation about a shaft 54 which is in parallel alignment with fixed shaft 52. Shaft 54 is connected by rod 56 to the pushbutton 42, and gear 50 is movable toward and away from gear 48 in response to the depression and release, respectively, of pushbutton 42.

A slidable first rack 58 is mounted in meshing engagement with gears 48, 50 on a first side thereof and second and third opposing racks 60, 62 are mounted in meshing engagement with gear 48 and 50, respectively, on the side thereof opposite from first rack 58.

A coil spring 64 is mounted on rod 56 between wall portion 66 in elongated opening 43 and the pushbutton 42, and provides a force to maintain the pushbutton 42 and the core carriage moving mechanism in a released or unactuated condition.

For purposes of affording a more complete understanding of the invention, it is advantageous now to provide a functional description of the mode in which the component parts thus far described cooperate.

Once a marker 46 has been positioned to and fixed at a predetermined location corresponding to a preselected wave signal setting, the depression of a corresponding pushbutton moves the core assembly carriage to that position. The fixing of the markers 46 to preselected positions can be accomplished in a variety of ways, any of which is well known to one skilled in the art.

Referring to FIG. 3, depression of pushbutton 42 in the direction of the arrow, against spring 64, causes gears 48, 50 to be rotated, as well as gear 50 to be moved toward gear 48.

In response to the above, each of the racks 60, 62 is moved in a direction toward the other until such time as one of the racks engages the fixed marker. Thus, for example, in the case of the arrangement of FIG. 3, marker 46 is positioned nearer rack 60, and the last-mentioned rack engages marker 46 prior to the engagement thereof by rack 62. When rack 60 engages marker 46, the movement of rack 60 is interrupted and it remains stationary in engagement with marker 46. Rack 62, however, continues to be moved toward rack 60 until such time as it also engages the fixed marker 46. Rack 62 engages the corresponding core carriage extension 47 during its movement toward marker 46 and thereby moves the carriage toward the marker 46. Thus, when rack 62 also engages marker 46, extension 47 of carriage 24 is aligned with marker 46 (FIG. 2).

Regardless of the location of marker 46 between racks 60, 62, the movable carriage extension 47 is moved into parallel alignment therewith upon depression of the pushbutton 42. The accurate positioning of the carriage is assured because of the similarity in width of the marker and extension member. The movable racks are moved always into engagement with the fixed marker located therebetween and thereby carry the movable carriage extension to a like position.

As described heretofore, rack 58 and racks 60, 62 are all in meshing engagement with similar gears 48, 50, having generally equal diameters. In the case of the embodiment of FIG. 3, the stroke of the pushbutton is magnified by two; i.e., the travel of pushbutton 42 when depressed is half that of the "resulting travel" of racks 60, 62. It should be understood that the "resulting travel" is the total movement of racks 60 and 62.

To alter the ratio of travel of the racks 60, 62 versus the pushbutton travel, the radii of the gears engaging the racks 58, 60, 62, may be changed.

Figure 4:
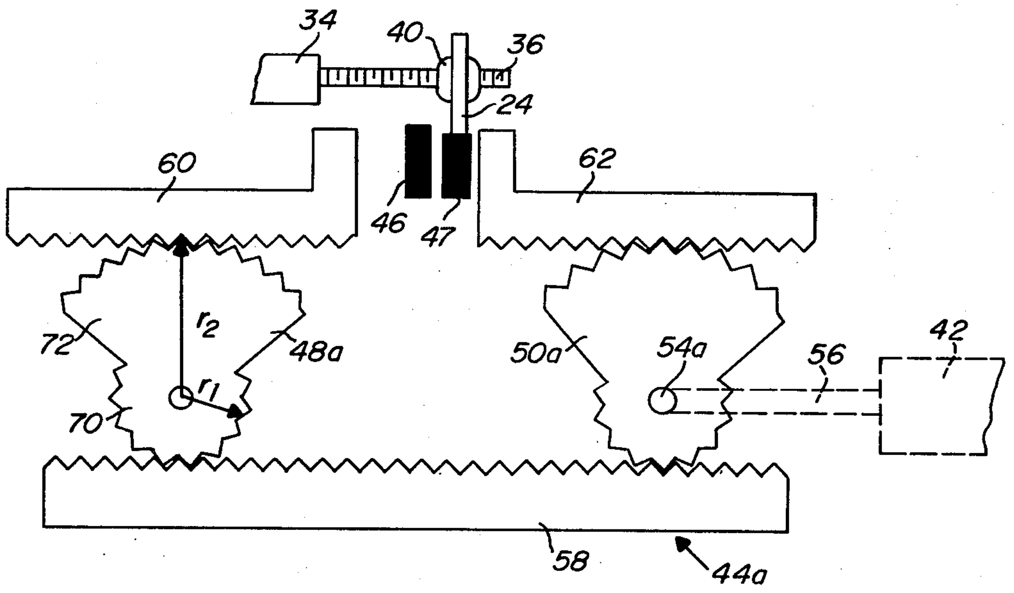
FIG. 4 is an alternative embodiment of the mechanism of FIG. 3.

Referring to FIG. 4, an alternative embodiment 44a of the mechanism is shown in which the ratio of travel of racks 60, 62, to the travel of pushbutton 42 is greater than in the case of the embodiment of the mechanism of FIG. 3.

In the case of the embodiment of FIG. 4, racks 58, 60 and 62 remain the same as in the first described embodiment of FIG. 3. The gears, however, are altered dimensionally. In the embodiment of FIG. 4, gears **48*a*, 50*a*, are provided, each of which are formed of segments of a pair of gears 70, 72, of differing radii; the radii $r1$ of gear segments 70 being half that of gear segment $r2$. Thus, for a stroke of a predetermined length for the pushbutton 42 connected to the central shaft 54a of gear 50a**, an output stroke of four times the length of the pushbutton stroke is provided.

The last-mentioned ratio of rack stroke to pushbutton stroke can be altered as desired by changing the radii of the gear segments, or the same effect can be achieved by providing first and second gears mounted fixedly for rotation on the same shaft and each engaging a different one of the racks. The segmented gears are used because they can be stamped from a single sheet of metal and thus are less expensive to produce and more easily assembled.

The ratio of output to input travel of the racks versus the pushbutton, respectively, can be expressed by the following formula:

$$\text{Ratio} = (r1 + r2/r1)$$

where: $r1$ = the pitch radius of the segment 70 of gears **48a, 50*a*; and $r2$ = the pitch radius of the segment 72 of gears 48*a*, 50*a***.

The operation of the embodiment of mechanism 44a of FIG. 4 is the same as that of the mechanism 44 of FIG. 3. When pushbutton 42 is depressed, the racks 60, 62 are moved toward each other until one of the racks (the one nearest fixed marker 46) engages the marker. The other continues toward marker 46, carrying core carriage 24 therewith as it engages extension 47, with the latter in alignment with marker 46, to place the carriage 24 at a proper setting. Cores 34 thereby are positioned at predetermined locations with respect to corresponding coils 22 to provide wave signal tuning of the radio receiver.

Thus, the mechanism according to the invention provides a relatively simple assembly for positioning, with accuracy, a member to a predetermined location selected by a fixed marker. While the mechanism has been shown in the environment of a radio tuner, it will be obvious to one skilled in the art that it can be used for positioning any movable control element to a predetermined position defined by a fixed marker.

While particular embodiments of the invention have been shown and described, it should be understood that the invention is not limited thereto since many modifications may be made. It is therefore contemplated to cover by the present application any and all such modifications as fall within the true spirit and scope of the appended claims.

I claim:

1. In a radio tuner mechanism including a plurality of wave signal tuner devices, each said device having a coil portion and a core portion movable with respect to the coil portion, said core portions of said tuner devices connected to a common carriage, said carriage being movable along a path to simultaneously alter the positions of the core portions with respect to corresponding coil portions, and a plurality of pushbuttons each mounted for movement in a predetermined direction between first and second positions for positioning said core carriage to predetermined locations, respectively, thereby causing said core portions to assume predetermined positions with respect to said coil portions, positioning means associated with each of said pushbuttons and fixable at a corresponding predetermined location, a plurality of core carriage moving mechanisms, one of which is connected to each of said pushbuttons for actuation in response to the movement of the latter to engage and move said core carriage to a different predetermined position determined by a corresponding positioning means, each said mechanism comprising a first gear mounted for rotation about a fixed axis, a second gear similar to said first gear, connected to said pushbutton at the axis thereof and movable therewith, the axes of said gears being substantially parallel to each other and said second gear being spaced from and substantially coplanar with said first gear, a first rack mounted for meshing engagement with each of said gears on one side thereof, and second and third racks, each being mounted in meshing engagement with one of said gears on the side thereof opposite said first rack for movement along a common path, whereby upon moving one of said pushbuttons from said first to said second position, the second and third racks of a corresponding core carriage moving mechanism are moved toward each other to engage said core carriage and a corresponding positioning means therebetween, thereby to move the said core carriage to said predetermined position designated by said positioning means.

2. In a radio tuner mechanism as claimed in claim 1 wherein said positioning means associated with each of said pushbuttons is movable to predetermined fixed positions between said second and third racks of each said core carriage moving mechanism for selecting a predetermined location to which said core carriage is to be moved upon movement of a corresponding pushbutton from said first to said second position, said second and third racks engaging both said fixable positioning means and said core carriage to align the latter with the former, whereby said core carriage is moved to the preselected location of said positioning means.

3. A mechanism for positioning a movable control element to a predetermined position defined by a fixed marker, said mechanism comprising: first gear means mounted for rotation about a fixed axis, second gear means mounted for rotation about an axis and being movable along a predetermined path, the axes of said gear means being substantially parallel, an actuator connected to said second gear means at said axis and movable between a first and second position, whereby said second gear means is moved along said predetermined path toward and away from said first gear means, respectively, a first rack mounted in meshing engagement with said gear means on a first side thereof, and second and third racks each being mounted in meshing engagement with a respective one of said gear means on a side thereof opposite said first rack, said first rack being substantially parallel to said second and third racks, portions of said second and third racks positioned on opposite sides of said movable control element and said fixed marker, and movable toward each other into engagement with both said marker and control element in response to the movement of said actuator from said first to said second position, whereby said control element is moved to a position substantially the same as said marker.

4. A mechanism as claimed in claim 3 wherein said gear means each include a first arcuate segment having a radius of a first length and a second arcuate segment having a radius shorter than said first arcuate segment, said first rack being in meshing engagement with the second arcuate segments of said gear means and said second and third racks being in meshing engagement with the first arcuate segments of said gear means, respectively, whereby the movement of said second and third racks is increased in relation to the movement of said actuator.

5. A tuner mechanism for a pushbutton type radio receiver comprising, a plurality of wave signal tuner core assemblies including a plurality of stationary tuning coils and an equal number of cores movable with respect to respective ones of said coils for altering the wave signal reception of said radio receiver, a movable carriage to which said movable cores are attached for simultaneous movement with respect to said coils, a plurality of pushbuttons each mounted for movement between first released and second depressed positions, each for moving said core carriage to a predetermined location, thereby causing said cores to assume predetermined positions with respect to said coils, marker means associated with each pushbutton, each positioned at a location whereat said core carriage is to be moved in response to the depression of a corresponding pushbutton and a plurality of core carriage driving mechanisms one of which is associated with each said pushbutton, each said core carriage driving mechanism including gear means coupled to said pushbutton and first and second normally separated racks mounted in meshing engagement with said gear means for movement toward and away from each other in response to the depression and release, respectively, of said pushbutton, whereby said racks engage said core carriage and respective marker means to move the former into alignment with the latter, thereby to alter the wave signal reception of said tuner mechanism to a predetermined setting.

6. A tuner mechanism as claimed in claim 5 wherein said gear means include a pair of gears, each mounted on separate parallel shafts for rotation thereon, respectively, one of said gear shafts being fixed and the other being mounted for movement toward and away from said first mentioned gear shaft, said first rack mounted in meshing engagement with said first gear and the second rack being mounted in meshing engagement with said second gear, said pushbutton being connected to said second gear shaft, whereby upon depression of said pushbutton, said racks are moved together to move said core carriage to said predetermined marker setting.

7. A mechanism for positioning a movable control element to a predetermined position defined by a fixed marker, said mechanism comprising gear means, an actuator movable between first and second positions coupled to said gear means, and first and second normally separated racks mounted in meshing engagement with said gear means for movement toward each other in response to the movement of said actuator from said first to said second position, said racks engaging said control element and said marker therebetween to move the former into alignment with the latter.

8. A mechanism as claimed in claim 7 wherein said gear means include first and second gears, each mounted for rotation about an axial shaft, the first mentioned gear being fixed at a predetermined position and the second gear being connected at said shaft to said actuator for movement therewith toward and away from said first gear, each of said racks being mounted in meshing engagement with a respective one of said gears.

9. A mechanism for positioning a movable control element to a predetermined position defined by a fixed marker, said mechanism comprising first and second members movable toward and away from each other along a predetermined path, said control element and marker positioned along said path between said members, actuator means movable in first and second directions along a predetermined path, and means coupling said actuator means and said members for moving said first and second members toward each other in response to the movement of said actuating means in said first direction to clamp said control element and marker therebetween, thereby to move said control element along said path substantially to the position defined by said marker.

10. A mechanism as claimed in claim 9 wherein said coupling means include a pair of generally circular members mounted for rotation on separate substantially parallel shafts, one of said members being movable along a path toward the other member and connected to said actuator means, each said first and second member being in contacting engagement with one of said rotatable members, whereby upon moving said actuator means in said first direction, said rotatable members are rotated to cause said first and second members to be moved toward each other, thereby to clamp said control element and marker therebetween.

11. A mechanism as claimed in claim 10, wherein said rotatable members are gears, wherein said first and second members are racks mounted in meshing engagement with said gears and wherein said actuator means include a pushbutton connected to said movable gear, whereby depression of said pushbutton moves said gear in said first direction and release thereof move said gear in the opposite direction.

* * * * *